United States Patent [19]
Yung et al.

[11] Patent Number: 5,434,569
[45] Date of Patent: Jul. 18, 1995

[54] METHODS FOR ADJUSTING THE COUPLING CAPACITOR OF A MULTI-STAGE WEIGHTED CAPACITOR A/D CONVERTER

[75] Inventors: Henry T. Yung, Richardson; Eric G. Soenen, Plano, both of Tex.

[73] Assignee: Texas Instruments Incorporated, Dallas, Tex.

[21] Appl. No.: 115,333

[22] Filed: Sep. 1, 1993

[51] Int. Cl.⁶ .............................................. H03M 1/10
[52] U.S. Cl. ..................................... 341/172; 341/120
[58] Field of Search ........................ 341/172, 120, 155

[56] References Cited

U.S. PATENT DOCUMENTS

| | | |
|---|---|---|
| 4,399,426 | 8/1983 | Tan . |
| 4,599,604 | 7/1986 | McKensie et al. . |
| 4,709,225 | 11/1987 | Welland et al. . |
| 4,799,042 | 1/1989 | Confalonieri et al. . |
| 4,999,633 | 3/1991 | Draxelmayr . |
| 5,235,335 | 8/1993 | Hester et al. .......................... 341/172 |

OTHER PUBLICATIONS

A Low-Power 12-b Analog-to-Digital Converter with On-Chip Precision Trimming, Michiel de Wit, et al., *IEEE Journal of Solid-State Circuits*, vol. 28, No. 4, Apr. 1993, pp. 455–461.

*Primary Examiner*—Howard L. Williams
*Attorney, Agent, or Firm*—Alan K. Stewart; Richard L. Donaldson; William E. Hiller

[57] ABSTRACT

A circuit for adjusting capacitors in a capacitor analog to digital converter has a main capacitor array including more than one capacitor array portion 20 and 22, and at least one first coupling capacitor $C_c$. A first plate of each first coupling capacitor $C_c$ is coupled to one capacitor array portion 22 and a second plate of each first coupling capacitor $C_c$ is coupled to a next more significant capacitor array portion 20 such that each capacitor array portion is coupled to the next more significant capacitor array portion by one of the first coupling capacitors $C_c$. The circuit has at least one second coupling capacitor $C_{c3}$ with a first plate of each second coupling capacitor $C_{c3}$ coupled to the first plate of a corresponding one of the first coupling capacitors $C_c$. The circuit also has at least one array of calibration capacitors 60–84 with first plates of each array of calibration capacitors 60–84 coupled to a second plate of a corresponding one of the second coupling capacitors $C_{c3}$ and second plates of each array of calibration capacitors 60–84 coupled to corresponding switches 100–124. Switch control signals $S_{c4}$, $S_{c3}$, $S_{c2}$, $S_{c1}$, and $S_{c0}$, and $S_4$, $S_3$, $S_2$, $S_1$, and $S_0$ control the switches such that each switch connects the corresponding calibration capacitor to either a first node $V_{ref+}$ or a second node $V_{ref-}$. Each switch control signal consists of two switch control bits which are combined by a logic function.

17 Claims, 3 Drawing Sheets

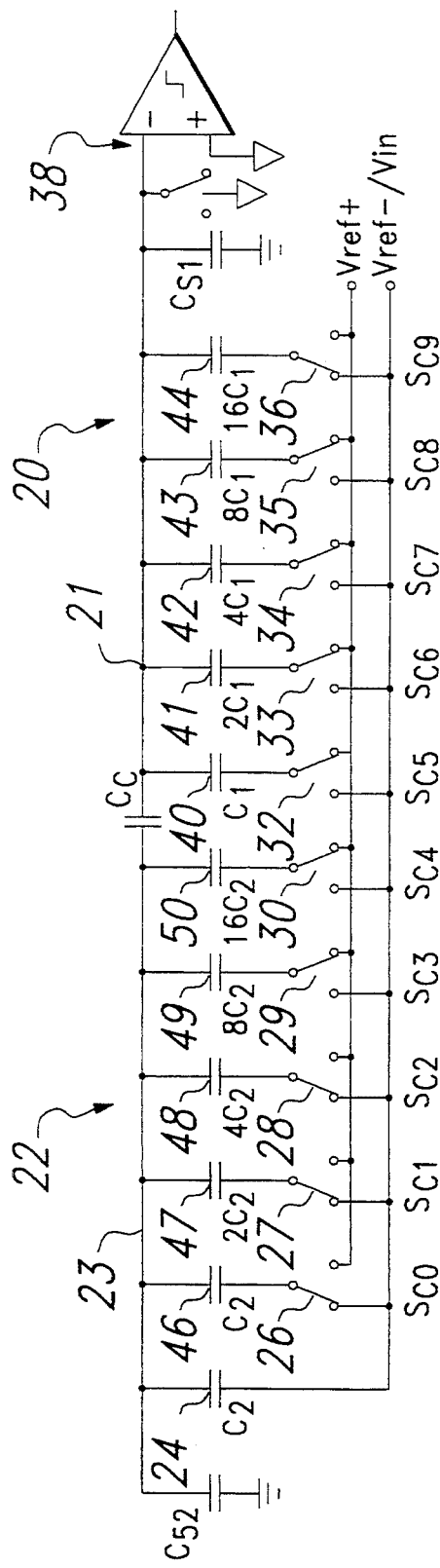
Fig. 1 PRIOR ART
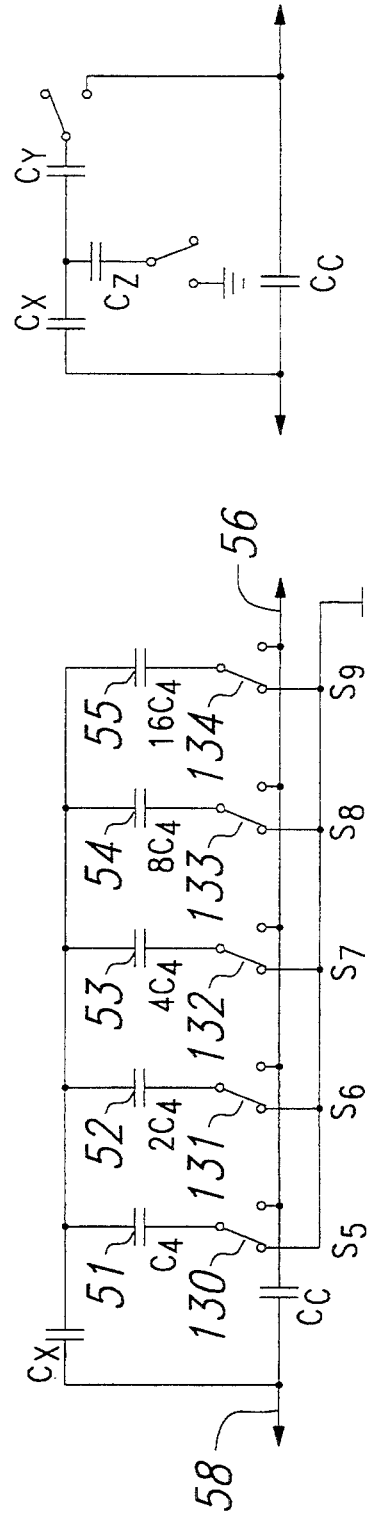

5,434,569

METHODS FOR ADJUSTING THE COUPLING CAPACITOR OF A MULTI-STAGE WEIGHTED CAPACITOR A/D CONVERTER

CROSS-REFERENCE TO RELATED APPLICATIONS

The present application is related to the commonly assigned patent application Ser. No. 07/892,447 filed Jun. 2, 1994, now U.S. Pat. No. 5,235,335, which is incorporated herein by reference.

1. Field of the Invention

This invention generally relates to semiconductor devices and circuits and specifically to methods for adjusting capacitors in multi-stage weighted capacitor analog to digital converters.

2. Background of the Invention

Without limiting the scope of the invention, its background is described in connection with a 2-stage binary-weighted switched capacitor analog to digital (A/D) converter, as an example. In switched capacitor circuits, the accuracy of the circuit depends upon capacitor ratios. In order to maximize the ratio accuracy, capacitors are usually comprised of identical unit capacitors. In linear A/D converters, the desired ratios are powers of 2. An eight bit A/D converter, for example, is composed of eight capacitors. The LSB (least significant bit) capacitor comprises one (or $2^0$) unit capacitor. The second LSB capacitor comprises two (or $2^1$) unit capacitors. The third LSB capacitor comprises four (or $2^2$) unit capacitors. Following the sequence, the MSB (most significant bit) capacitor or, in other words, the eighth LSB capacitor comprises 128 (or $2^7$) unit capacitors. Also, these arrays typically have an additional unit capacitor that serves as a terminating capacitor. Thus the total array requires $2^8$ unit capacitors. A/D converters with resolution well beyond eight bits require an impractically large number of unit capacitors. One of the problems is that the total capacitance becomes so large that the input signal source and reference voltage source cannot drive the array at a reasonable speed. Also, if the unit capacitor size is reduced, ratio accuracy may be compromised. Therefore, for higher resolution, an alternative to a simple parallel array is required.

One alternative is called a "series-coupled array". In this circuit, the array is divided into at least two portions including a most significant portion which includes a number M capacitors and a least significant portion which includes L capacitors. The array can also have additional portions between the most significant portion and the least significant portions. The LSB capacitor of each portion comprises one unit capacitor, the second LSB capacitor of each portion comprises two unit capacitors and so on. The size of the unit capacitor may be the same for all portions or may be different for each portion.

Each portion of the array is coupled to the next more significant portion by a coupling capacitor. The first plate of a coupling capacitor is coupled to the top plates of each of the capacitors in one portion of the array and the second plate of the coupling capacitor is coupled to the top plates of each of the capacitors in the next more significant portion of the capacitor array.

The value of the coupling capacitance depends upon parasitic capacitances in the array. A parasitic capacitance will be associated with each portion of the array. Taking the parasitic capacitance into account, the ideal value for the coupling capacitance $C_c$ in an array having two portions is $$C_C = C_1 \left[ \frac{2^L C_2 + C_{S2}}{2^L C_2 - C_1} \right]$$

where $C_1$ is the unit capacitance in the most significant portion of the capacitor array, $C_2$ is the unit capacitance in the least significant portion of the capacitor array, $C_{S2}$ is the parasitic capacitance associated with the least significant portion of the capacitor array, and L is the number of capacitors in the least significant portion of the array. The above equation shows the functional dependence of the coupling capacitor on the parasitic capacitance. The above equation also accounts for a terminating capacitor with a value of $C_2$ in the least significant portion of the array.

SUMMARY OF THE INVENTION

It has been discovered that when a capacitor in the trim array is disconnected by turning off a switch, there is still parasitic capacitance at the bottom plate due to both the capacitor itself and the switch. The series combination of the parasitic capacitance and the capacitor itself gives rise to a residual capacitance. This makes it difficult to match and control the capacitance in the trim array.

Generally, and in one form of the invention, a circuit for adjusting capacitors in a capacitor analog to digital converter has a main capacitor array including more than one capacitor array portion and at least one first coupling capacitor. A first plate of each first coupling capacitor is coupled to one capacitor array portion and a second plate of each first coupling capacitor is coupled to a next more significant capacitor array portion such that each capacitor array portion is coupled to the next more significant capacitor array portion by one of the first coupling capacitors. The circuit has at least one second coupling capacitor with a first plate of each second coupling capacitor coupled to the first plate of a corresponding one of the first coupling capacitors. The circuit also has at least one array of calibration capacitors with first plates of each array of calibration capacitors coupled to a second plate of a corresponding one of the second coupling capacitors and second plates of each array of calibration capacitors coupled to corresponding switches. Switch control signals control the switches such that each switch connects the corresponding calibration capacitor to either a first node or a second node. Each switch control signal consists of two switch control bits which are combined by a logic function.

In another form of the invention, a circuit for adjusting capacitors in a capacitor analog to digital converter has a main capacitor array including more than one capacitor array portion and at least one coupling capacitor. A first plate of each coupling capacitor is coupled to one capacitor array portion and a second plate of each coupling capacitor is coupled to a next more significant capacitor array portion such that each capacitor array portion is coupled to the next more significant capacitor array portion by one of the coupling capacitors. The circuit has at least one first calibration capacitor with a first plate of each first calibration capacitor coupled to the first plate of a corresponding one of the coupling capacitors. The circuit also has at least one array of second calibration capacitors with first plates of each array of second calibration capacitors coupled to a second plate of a corresponding one of the first calibration capacitors and second plates of each array of second calibration capacitors coupled to corresponding switches. Switch control signals control the switches such that each switch connects the corresponding calibration capacitor to either a second plate of the corresponding one of the coupling capacitors or a reference voltage.

One advantage of this invention is that it is insensitive to bottom-plate parasitic capacitances, as described above, which makes it easy to match and control the capacitance in the trim array.

BRIEF DESCRIPTION OF THE DRAWINGS

In the drawings:

FIG. 1 is a circuit diagram of a prior art 2-stage binary weighted capacitor A/D converter;

FIG. 2 is a circuit diagram of a first preferred embodiment Y-network capacitor trim array in parallel with the coupling capacitor of FIG. 1;

FIG. 3 is a simplified circuit diagram of the device of FIG. 2;

Corresponding numerals and symbols in the different figures refer to corresponding parts unless otherwise indicated.

DETAILED DESCRIPTION OF PREFERRED EMBODIMENTS

Figure 4:
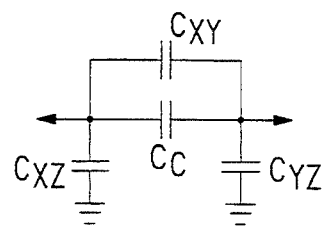
FIG. 4 is t, he equivalent circuit of that shown in FIG. 3 after a Y to Δ conversion.

FIG. 1 is a circuit diagram of a 2-stage binary weighted capacitor analog to digital (A/D) converter. The A/D converter of FIG. 1 includes most significant array portion 20, least significant array portion 22, coupling capacitor $C_c$, parasitic capacitances $C_{s1}$ and $C_{s2}$, terminating capacitor 24, least significant array switches 26-30, least significant array switch control bits $S_{c4}$, $S_{c3}$, $S_{c2}$, $S_{c1}$, and $S_{c0}$, most significant array switches 32-36, most significant array switch control bits $S_{c9}$, $Sc8$, $S_{c7}$, $S_{c6}$, and $S_{c5}$, and output circuitry 38. The most significant array portion 20 includes capacitors 40-44. The least significant array portion 22 includes capacitors 46-50.

The 2-stage binary-weighted capacitor A/D converter, shown in FIG. 1, is an example of a series coupled array. The circuit in FIG. 1 is a 10-bit version consisting of two 5-bit arrays, where each capacitor in the most significant array portion 20 consists of one or more unit capacitors with a unit capacitance value of $C_1$ and each capacitor in the least significant array portion 22 consists of one or more unit capacitors with a unit capacitance value of $C_2$. The five capacitors in the most significant array portions have values of $C_1$, $2 \times C_1$, $4 \times C_1$, $8 \times C_1$, and $16 \times C_1$. The five capacitors in the least significant array portions have values of $C_2$, $2 \times C_2$, $4 \times C_2$, $8 \times C_2$, and $16 \times C_2$. The terminating capacitor 24 has a capacitance value of $C_2$. $C_{s1}$ and $C_{s2}$ are the stray capacitances (parasitic capacitances) on the most significant and least significant array portions, respectively.

Typically, the capacitor mismatches limit the accuracy of the converter to about 10 bits. To extend the accuracy beyond that normally requires some sort of trimming. One trimming method is to add auxiliary capacitor arrays to calibrate the errors due to capacitor mismatch in the main array. One component that frequently needs to be calibrated is the coupling capacitor $C_c$. The ideal value of $C_c$ for the circuit of FIG. 1 is given by the following equation $$C_C = \left(1 + \frac{C_1 + C_{S2}}{32C_2 - C_1}\right)C_1$$

where the terminating capacitor 24 has been accounted for in the equation.

As seen from the equation, the error in $C_c$ can be compensated by adjusting the stray capacitance $C_{s2}$. This has been implemented before by adding a binary weighted trim array to the LSB array. This is described in the above-referenced U.S. Pat. No. 5,235,335, which is incorporated herein by reference. The amount of stray capacitance can be adjusted by switching on different amounts of capacitances.

FIG. 2 is a circuit diagram of a first preferred embodiment Y-network capacitor trim array in parallel with the coupling capacitor $C_c$ of FIG. 1. The circuit of FIG. 2 includes trim capacitors 51-55, small trim capacitor $C_x$, coupling capacitor $C_c$, switches 130-134, and switch control bits $S_5$, $S_6$, $S_7$, $S_8$, and $S_9$. Each trim capacitor consists of one or more unit capacitors with a unit capacitance value of $C_4$. The capacitance values of the five trim capacitors are $C_4$, $2 \times C_4$, $4 \times C_4$, $8 \times C_4$, and $16 \times C_4$. Line 56 connects one plate of the coupling capacitor $C_c$ to line 21 of the most significant array portion 20, shown in FIG. 1. Line 58 connects the other plate of the coupling capacitor $C_c$ to line 23 of the least significant array portion 22, shown in FIG. 1.

Coupling capacitor $C_c$ is adjusted directly by the Y-network capacitor trim array of FIG. 2. The trim network consists of a binary-weighted capacitor array (capacitors 51-55) in series with a small capacitor $C_x$. The capacitors in the array are switched between ground and the most significant array portion 20. The switching arrangement of the capacitors 51-55 depends on the amount of compensation required. Without the small capacitor $C_x$, the trim capacitors 51-55 in the binary-weighted array would have to be extremely small, which would make this method impractical.

FIG. 3 is a simplified circuit diagram of the circuit in FIG. 2. In FIG. 3, the capacitors switched to ground are modeled by $C_z$ and the capacitors switched to the most significant array portion 20 are modeled by $C_y$. The sum of $C_z$ and $C_y$ is constant ($C_z + C_y = C_4 + 2C_4 + 4C_4 + 8C_4 + 16C_4$). Performing a Y to Δ conversion on the circuit of FIG. 3 gives an equivalent circuit, shown in FIG. 4. The following equations give the capacitor values for the equivalent circuit of FIG. 4:

$$C_{XY} = \frac{C_X C_Y}{C_X + C_Y + C_Z}$$

$$C_{YZ} = \frac{C_Y C_Z}{C_X + C_Y + C_Z}$$

$$C_{XZ} = \frac{C_X C_Z}{C_X + C_Y + C_Z}$$

By adjusting the trim array, the coupling capacitor $C_c$ is adjusted. In addition, both the stray capacitances $C_{s2}$ and $C_{s1}$ are also adjusted.

To prevent potential bootstrapping, the trim array needs to be switched between, ground and the most significant array portion 20 rather than between ground and the least significant array portion 22.

Figure 5:
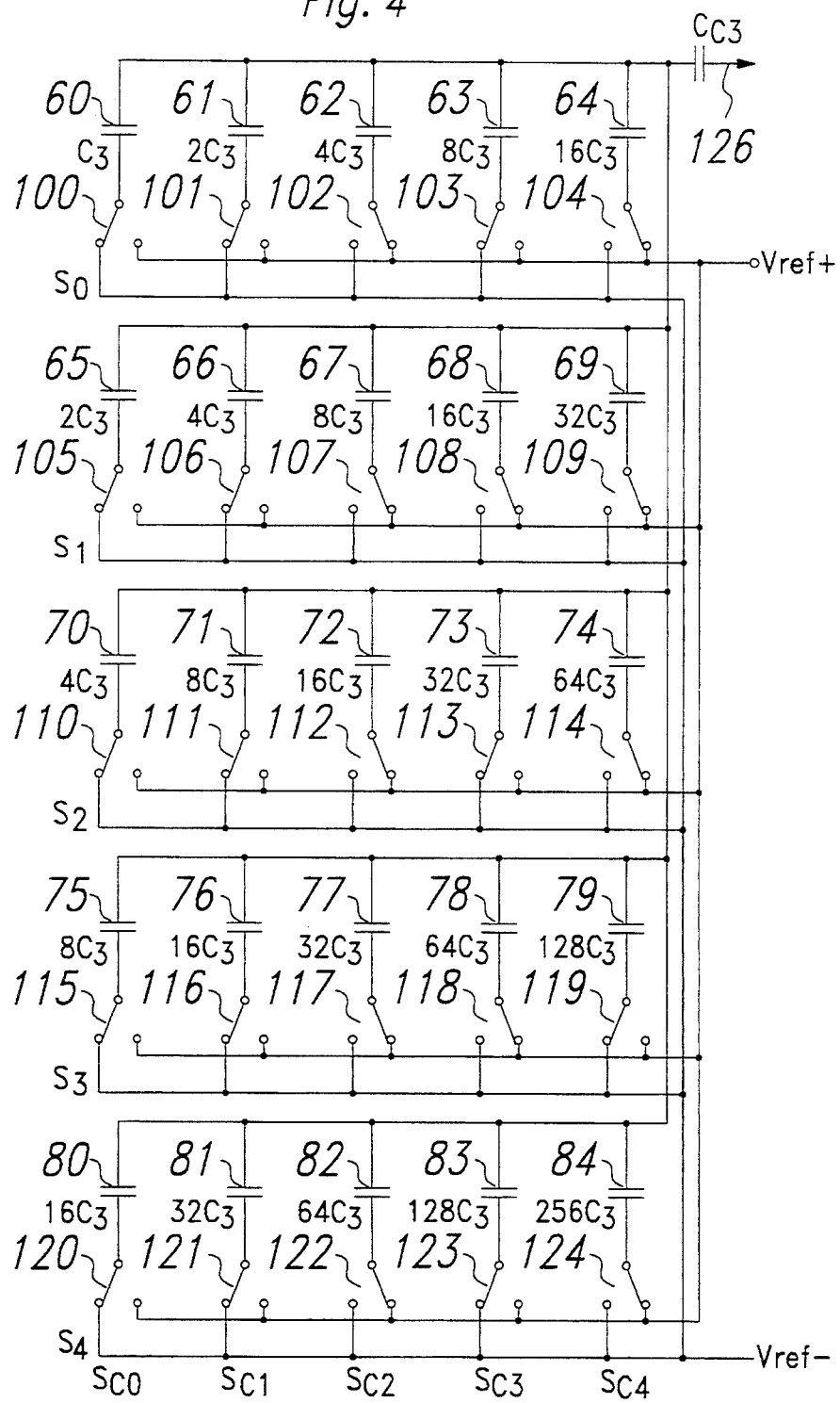
FIG. 5 is a circuit diagram of a second preferred embodiment five bit capacitor trim array.

A second preferred embodiment five-bit trim array is shown in FIG. 5. The trim array in FIG. 5 effectively adjusts both $C_{s2}$ and $C_2$ to correct the error due to $C_c$. The circuit of FIG. 5 includes twenty-five trim capacitors 60–84 arranged in five rows of five capacitors each. The trim capacitor values are in multiples of the unit capacitor $C_3$. The capacitor values are $C_3$, $2 \times C_3$, $4 \times C_3$, $8 \times C_3$, $16 \times C_3$, $32 \times C_3$, $64 \times C_3$, $128 \times C_3$, and $256 \times C_3$. The circuit also includes twenty-five switches 100–124, coupling capacitor $C_{c3}$, and switch control bits $S_{c4}$, $S_{c3}$, $S_{c2}$, $S_{c1}$, and $S_{c0}$, and $S_4$, $S_3$, $S_2$, $S_1$, and $S_0$. Line 126 connects the coupling capacitor $C_{c3}$ to line 23 of the least significant array portion 22, shown in FIG. 1.

The switch control bits $S_{c4}$, $S_{c3}$, $S_{c2}$, $S_{c1}$, and $S_{c0}$ are each associated with a column in the capacitor array. The switch control bits $S_4$, $S_3$, $S_2$, $S_1$, and $S_0$ are each associated with a row in the capacitor array. The two switch control bits associated with each individual switch are combined by a logic "and" to control the switch. For example, if both $S_4$ and $S_{c4}$ are a logic "1", the capacitor 124 ($256C_3$) will be switched to $V_{ref+}$. Otherwise, capacitor 124 ($256C_3$) will be switched to $V_{ref-}$. The switch control bits $S_{c4}$, $S_{c3}$, $S_{c2}$, $S_{c1}$, and $S_{c0}$ also control the least significant array switches 26–30.

The bits $S_4$, $S_3$, $S_2$, $S_1$, and $S_0$ determine how much capacitance is switched to $C_2$'s and to $C_{s2}$. Since the bottom plates of the capacitors are always switched to a low impedance source, this method is insensitive to bottom-plate parasitic capacitances described before. This makes it easy to match and control the capacitance in the trim array. To maintain matching among the binary-weighted capacitors 26–30 in the least significant array portion 22, the capacitors 100–124 in the trim array, which are expressed in terms of $C_3$, are binary-weighted for all possible combinations of $S_4$, $S_3$, $S_2$, $S_1$, and $S_0$. The coupling capacitor of the trim array $C_{c3}$ is designed such that it attenuates the adjustments to the desirable trimming range.

One advantage of this second preferred embodiment is that the bottom plates of the calibration capacitors are always switched to a low impedance source.

To reduce the number of capacitors and switches required, the trim array shown in FIG. 5 can be modified. The modified trim array is demonstrated by a third preferred embodiment, shown in FIG. 6. The circuit of FIG. 6 includes fifteen trim capacitors 140–154 arranged in five rows. The top row contains one trim capacitor 140, the second row contains two trim capacitors 141 and 142, the third row contains three trim capacitors 143, 144, and 145, the fourth row contains four trim capacitors 146, 147, 148, and 149, and the fifth row contains five trim capacitors 150, 151, 152, 153, and 154. The trim capacitor values are in multiples of the unit capacitor $C_5$. The capacitor values are $C_5$, $2 \times C_5$, $4 \times C_5$, and $8 \times C_5$. The circuit also includes coupling capacitor $C_{c5}$, fifteen switches 160–174, and switch control bits $S_{c4}$, $S_{c3}$, $S_{c2}$, $S_{c1}$, $S_{c0}$, $S_4$, $S_3$, $S_2$, $S_1$, and $S_0$. The switch control bits operate the same as for the second preferred embodiment described above. Line 180 connects the coupling capacitor $C_{c5}$ to line 23 of the least significant array portion 22, shown in FIG. 1.

Figure 6:
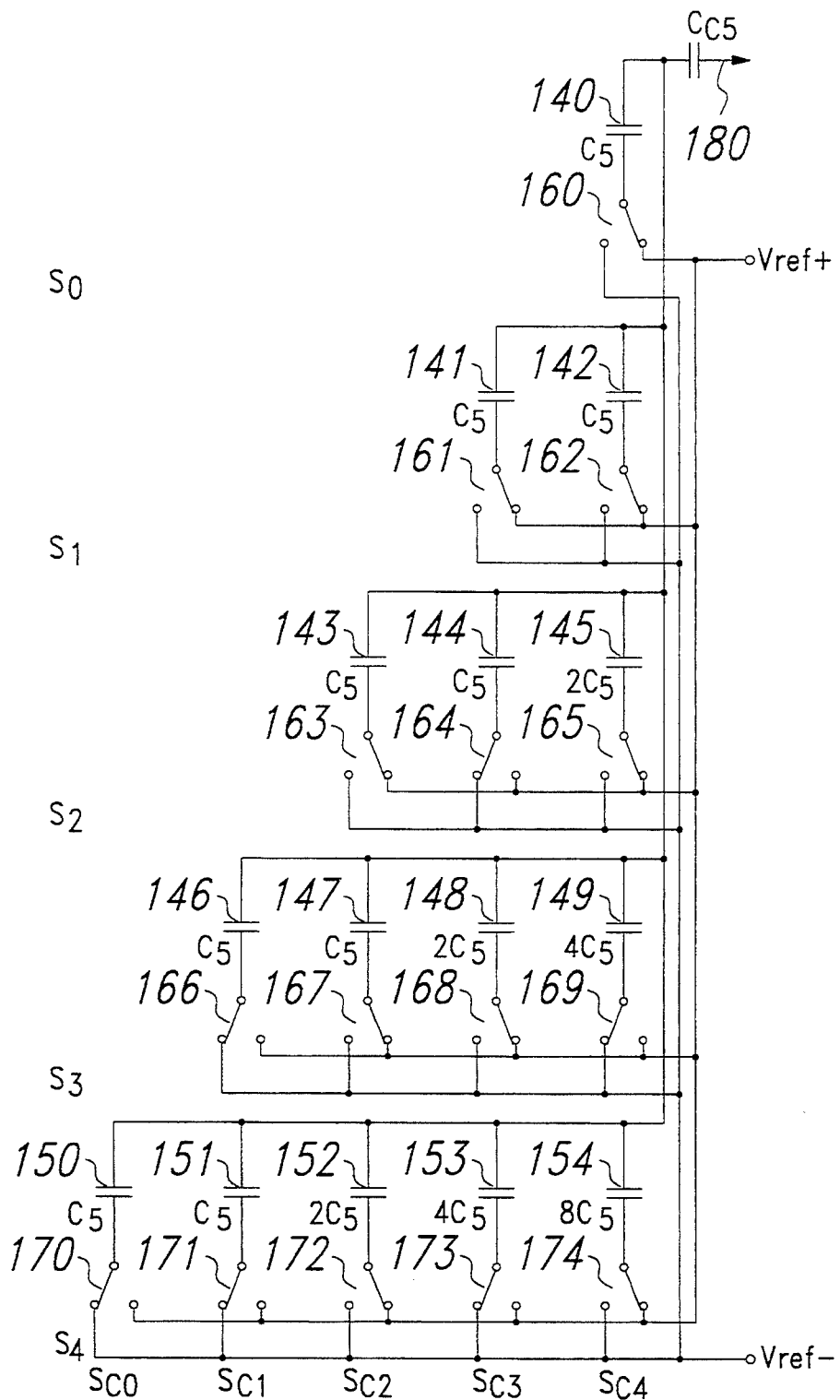
FIG. 6 is a circuit diagram of a third preferred embodiment five bit capacitor trim array.

For all possible combinations of $S_4$, $S_3$, $S_2$, $S_1$, and $S_0$, the capacitors in the trim array in FIG. 6 are only approximately binary-weighted. However, the additional errors are limited.

A few preferred embodiments have been described in detail hereinabove. It is to be understood that the scope of the invention also comprehends embodiments different from those described, yet within the scope of the claims.

For example, trim arrays that adjust both $C_{s2}$ and $C_2$ can also be implemented with multi-stage arrays instead of single-stage arrays described above. Also, the trim arrays in the embodiments described above are five bit versions, but these arrays can be of any size depending on what is necessary for the particular A/D converter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for adjusting capacitors in a capacitor analog to digital converter comprising:
   a main capacitor array including:
      more than one capacitor array portion;
      at least one first coupling capacitor, a first plate of each first coupling capacitor coupled to one capacitor array portion and a second plate of each first coupling capacitor coupled to a next more significant capacitor array portion such that each capacitor array portion is coupled to the next more significant capacitor array portion by one of the at least one first coupling capacitor;
   at least one second coupling capacitor, a first plate of each second coupling capacitor coupled to the first plate of a corresponding one of the at least one first coupling capacitor;
   at least one array of calibration capacitors, first plates of each array of calibration capacitors coupled to a second plate of a corresponding one of the at least one second coupling capacitor and second plates of each array of calibration capacitors coupled to corresponding switches;
   switch control signals which control the switches such that each switch connects the corresponding calibration capacitor to either a first node or a second node, each switch control signal consists of a horizontal switch control bit and a vertical switch control bit;
   each array of calibration capacitors is arranged in rows and columns with each horizontal switch control bit associated with a corresponding one of the rows and each vertical switch control bit associated with a corresponding one of the columns.

2. The circuit of claim 1 wherein the at least one array of calibration capacitors are binary weighted arrays.

3. The circuit of claim 1 wherein each calibration capacitor consists of one or more unit capacitors.

4. The circuit of claim 1 wherein the vertical switch control bits also serve as the switch control bits for the capacitor array portion that is coupled to the first plate of the corresponding one of the at least one first coupling capacitor.

5. The circuit of claim 1 wherein all the rows in each array of calibration capacitors contain the same number of calibration capacitors.

6. The circuit of claim 5 wherein the number of calibration capacitors in each row is equal to the number of bits in the capacitor array portion that is coupled to the first plate of the corresponding one of the at least one first coupling capacitor.

7. The circuit of claim 1 wherein all the rows in each array of calibration capacitors do not contain the same number of calibration capacitors.

8. The circuit of claim 7 wherein each row in the array of calibration capacitors contains one more calibration capacitor than the previous row.

9. The circuit of claim 8 wherein the number of calibration capacitors in the row with the most calibration capacitors is equal to the number of bits in the capacitor array portion that is coupled to the first plate of the corresponding one of the at least one first coupling capacitor.

10. The circuit of claim 1 wherein the first node is coupled to a first reference voltage and the second node is coupled to a second reference voltage.

11. A circuit for adjusting capacitors in a capacitor analog to digital converter comprising:
a main capacitor array including:
more than one capacitor array portion;
at least one coupling capacitor, a first plate of each coupling capacitor coupled to one capacitor array portion and a second plate of each coupling capacitor coupled to a next more significant capacitor array portion such that each capacitor array portion is coupled to the next more significant capacitor array portion by one of the at least one coupling capacitor;
at least one first calibration capacitor, a first plate of each first calibration capacitor coupled to the first plate of a corresponding one of the at least one coupling capacitor;
at least one array of second calibration capacitors, first plates of each array of second calibration capacitors coupled to a second plate of a corresponding one of the at least one first calibration capacitor and second plates of each array of second calibration capacitors coupled to corresponding switches;
switch control signals which control the switches such that each switch connects the corresponding second calibration capacitor to either a second plate of the corresponding one of the at least one coupling capacitor or a reference voltage.

12. The circuit of claim 11 wherein the array of second calibration capacitors comprises a binary weighted array.

13. The circuit of claim 11 wherein each of the second calibration capacitors consists of one or more unit capacitors.

14. The circuit of claim 11 wherein the reference voltage is ground voltage.

15. A method for adjusting capacitors in a capacitor analog to digital converter having a main capacitor array including more than one capacitor array portion and at least one first coupling capacitor, comprising:
coupling a first plate of each first coupling capacitor to one capacitor array portion and coupling a second plate of each first coupling capacitor to a next more significant capacitor array portion such that each capacitor array portion is coupled to the next more significant capacitor array portion by one of the at least one first coupling capacitor;
coupling a first plate of at least one second coupling capacitor to the first plate of a corresponding one of the at least one first coupling capacitor;
coupling first plates of at least one array of calibration capacitors to a second plate of a corresponding one of the at least one second coupling capacitor and coupling second plates of each array of calibration capacitors to corresponding switches;
switching the second plate of each calibration capacitor to either a first reference voltage or a second reference voltage using switch control signals to control the corresponding switch, each switch control signal consisting of a horizontal switch control bit and a vertical switch control bit;
arranging each array of calibration capacitors in rows and columns with each horizontal switch control bit associated with a corresponding one of the rows and each vertical switch control bit associated with a corresponding one of the columns.

16. The method of claim 15 wherein the at least one array of calibration capacitors are binary weighted arrays.

17. The method of claim 15 wherein the second reference voltage is ground voltage.

* * * * *